United States Patent [19]

Yoshimura et al.

[11] Patent Number: 5,681,651
[45] Date of Patent: *Oct. 28, 1997

[54] MULTILAYER COATED HARD ALLOY CUTTING TOOL

[75] Inventors: Hironori Yoshimura; Tetsuya Tanaka; Yoshikazu Okada, all of Ibaraki-ken, Japan

[73] Assignee: Mitsubishi Materials Corporation, Tokyo, Japan

[*] Notice: The term of this patent shall not extend beyond the expiration date of Pat. No. 5,374,471.

[21] Appl. No.: 301,583

[22] Filed: Sep. 7, 1994

Related U.S. Application Data

[63] Continuation of Ser. No. 982,572, Nov. 27, 1992, Pat. No. 5,374,471.
[51] Int. Cl.$^6$ .................................................. C23C 9/00
[52] U.S. Cl. ........................... 428/216; 51/307; 51/309; 428/336; 428/472; 428/697; 428/698; 428/699; 428/701; 407/119
[58] Field of Search .................................... 428/216, 336, 428/472, 698, 697, 699, 701, 702; 51/307, 309; 407/119

[56] References Cited

U.S. PATENT DOCUMENTS

| | | | |
|---|---|---|---|
| 4,714,660 | 12/1987 | Gates, Jr. | 426/699 |
| 4,746,563 | 5/1988 | Nakano et al. | 428/695 |
| 4,984,940 | 1/1991 | Bryant et al. | 428/698 |
| 5,250,367 | 10/1993 | Santhanam et al. | 428/697 |

*Primary Examiner*—Archene Turner
*Attorney, Agent, or Firm*—Oblon, Spivak, McClelland, Maier, & Neustadt, P.C.

[57] ABSTRACT

The present invention concerns a tungsten carbide base cutting tools formed on sintered hard alloy substrate material. Multiple hard coatings are deposited on the Co-enriched surface layer of the substrate material, and Co-enriched surface layer occurs within a surface layer region that is 50 μm from an interface of said substrate material, wherein the Co content in said surface layer that is 5–10 μm from an interface of said substrate material is within a range from 15–25% by weight; wherein the Co content in said surface layer is more than the Co content in the core, and wherein the content of the carbides of Ti, Ta and Nb is lower than that in the core. The multilayer coating consists of a primary coating of TiCN, a secondary coating of $Al_2O_3$ and the surface coating consisting of at least one of TiCN and TiN. The interface between the substrate material and the primary coating is provided with a first intermediate coating consisting of TiN. The interface between the primary coating and the secondary coating is provided with a second intermediate coating consisting of at least one layer of TiC, TiCO or TiCNO.

40 Claims, 3 Drawing Sheets

MULTILAYER COATED HARD ALLOY CUTTING TOOL

This is a continuation of application Ser. No. 07/982,572, filed on Nov. 27, 1992, now U.S. Pat. No. 5,374,471.

BACKGROUND OF THE INVENTION

1. Technical Field

The present invention relates to hard alloy cutting tools having multilayer surface coatings for providing good adhesion, wear and chipping resistance.

2. Technical Background

The application of coated hard alloys for insert cutting tools (referred to as inserts hereinbelow) has been gaining popularity in recent years. For disposable inserts, the percentage of the coated tools has reached about 40% in Japan, and more than 60% in western countries.

One reason for such popularity for the coated inserts is the improvement in the toughness of the substrate materials.

It is known generally that when the surface of hard alloys is protected with a hard coating, although the wear resistance is improved, the resistance to chipping is degraded. To rectify this problem, it is essential to improve the toughness of the substrate material.

However, improving the toughness often means sacrificing the hardness which provides a basis of wear resistance but is in a converse relationship to toughness.

For this reason, the past solutions for improving the toughness of coated hard alloys involved mainly the surface layer portion of the substrate material, not the substrate material itself. The concept is that if the interior (core) of the hard alloys is hard, and the surface layers of the substrate material is tough, both wear resistance and chipping resistance can be improved simultaneously.

In fact, many of the coated hard alloy inserts in the markets for cutting steels and ductile cast irons, are made so that the surface layer is high in Co and has high toughness, and the core is relatively low in Co and has high hardness.

Such materials were first disclosed in a Japanese Patent Application, First Publication, No. Sho 52(1977)-110,209, which disclosed a coated hard alloy of improved toughness as a result of having a surface layer thickness of 10–200 μm, whose hardness is lowered by 2–20% compared with that of the core of the substrate material.

In this patent application, the first embodiment shows a substrate material of a composition, WC-10% TiC-10% Co (by weight in all the subsequent cases, unless otherwise stated). coated with a slurry of WC-10% Co, dried and sintered at 1430° C. for one hour to prepare a surface layer thickness of 130 μm, Vicker's hardness of 1320 in the surface layer, and 1460 in the core. There are no TiC particles, which are brittle, in the surface layer and the volume percent of the Co phase in the surface layer is higher than that in the core. A chemical vapor deposited (CVD) TiC coating of a 6 μm thickness is provided on the Co-enriched surface layer, thereby producing a coated high toughness hard alloy.

In the second embodiment, a TiC coated hard alloy is presented in which a mixture consisting of WC-6% Co and WC-10% Co is press, compacted and sintered to produce a substrate material having a surface layer thickness of 80 μm, and Vicker's hardness of 1320, and a core Vicker's hardness of 1450.

The embodiments of the Japanese Patent Application, First Publication No. Sho 53(1978)-131,909, involves a sintered hard alloy having a Co surface coating, to produce a sintered hard alloy with a Vicker's hardness of 1050 at the surface. Another embodiment of the above-noted patent application, involves the steps of preparing the mixture, a first sintering, coating the surface with graphite and a second sintering, to produce a toughness substrate material having a Vicker's hardness of 1160 at the surface.

One of the programs of producing a coated hard alloy according to the above noted Applications (No. 110,209 and No. 131,909) is the high cost. An excellent example of prior art proposed for solving this problem, there is U.S. Pat. No. 4,277,283.

The U.S. Pat. No. 4,277,283 (JPA, First Publication,Sho 54(1979)-No. 87,719, discloses in the claims, an example of a coated substrate material having high toughness in surface layers with a thickness of 5–200 μm, in which the proportion of the B-1 type hard phases, TiC, TaC and TiN containing W, in the surface layer, is lower compared with that in the core.

The first embodiment of the above-noted patent, discloses a sintered hard metal, produced from a powdered mixture consisting of WC-4% $(Ti_{0.75}W_{0.25})(C_{0.68}N_{0.32})$-5% $(Ta_{0.75}Nb_{0.25})$C-5.5% Co, and by heating the mixture in a $1\times10^{-3}$ vacuum at 1450° C. to eliminate the B-1 type hard phase completely to a depth of 10 μm, so that the surface layer is virtually all WC-Co. The surface of the substrate material is coated with a 6 μm thick CVD TiC coating to produce a coated hard alloy cutting tool. The toughness of this tool is high because the surface layer becomes enriched with Co as the B-1 type hard phase is eliminated.

However, when the hard alloy cutting tool according to U.S. Pat. No. 4,277,283 was used as a toll for high speed heavy cutting, it was still found to be insufficient due to failures such as breakage, because the Co enriched surface layer had a Co content 1.5–2.5 times greater than the average Co content of the core.

Another U.S. Pat. No. 4,610,931 discloses a coated hard alloy similar the coated hard alloy disclosed in U.S. Pat. No. 4,277,283.

This patent further discloses the following: hard alloys containing no free carbon particles in which a rake surface is removed by grinding and re-treated with heat to covert the nitrides and carbonitrides in the surface layer to carbides; a Co-enriched surface hard alloy; and the above-treated and coated hard alloy.

The first embodiment of this patent shows a material WC-10.3% TaC-5.85% TiC-0.2% NbC-8.5% Co-1.5% TiN, which is heated at 1496° C. for 30 minutes; sintered in a vacuum; made into a cutting insert after which the upper and lower surfaces (rake surfaces) are ground; heated again at 1427° C. for 60 minutes in a vacuum at 100 μm Hg, and after cooling at a given rate to 1204° C., the flank surface is ground. The surface is coated with TiC and TiN coatings using the usual CVD coating method to produce coated hard alloys having no free carbon particles, and having a Co-enriched layer and no B-1 type hard phases to a depth of 22.9 μm, and coated with a multilayer consisting of 5 μm thick TiC, 3 μm thick TiCN and 1 μm thick TiN layers.

Another U.S. Pat No. 4,830,930 (corresponding JPA, First Publication Sho 63(1988)- No.169,356) to increase the Co content of the surface layer, discloses in the claims, a hard alloy substrate material, in which the surface layer having a thickness of 100 to 500 μm, contains a gradient of a binder phase (Co-containing phase) such that the binder phase concentration is highest at the surface and levels off to a depth of 5 μm towards the core.

The first embodiment of the above-noted patent discloses a method of producing a substrate material by the following steps: preparing compacts of a powder mixture of WC-5% TiC-7% Co; sintering the compacts at 1380° C. for one hour, carburizing at 1330° C. for 10 minutes in an atmosphere of a 20 torr 80% $H_2$-20% $CH_4$ mixture; decarburizing at 1310° C. for 2 minutes in an atmosphere of 10 torr 90% $H_2$-10% $CO_2$ mixture; and cooling in a vacuum; thereby obtaining a microstructure having a Co content which is highest at the surface and gradually decreases towards the core Co content. The substrate material prepared in this manner is coated with a CVD TiC coating of a 5 μm thickness.

However, the Co-enriched surface layer of the hard alloy cutting tool according to U.S. Pat. No. 4,830,930 has a Co content 2.2 times greater than the average Co content of the core.

The third embodiment of the above-noted patent discloses, a hard alloy comprising a surface and an inner portion, characterized in that the concentration of the Co-enriched layer is highest (relative Co content is 380%) at the outermost surface of the body and approaches the concentration of the inner portion.

The preferred embodiments of the above-noted application discloses, a coated hard alloy material with a Co-enriched surface layer, having 2 μm of TiC, 2 μm of TiCN and 2 μm of TiN produced according to the chemical vapor deposition method.

The hard alloy cutting tool according to U.S. Pat. No. 4,830,930 discloses a coated hard alloy material having a Co-enriched surface on which the first coating of TiC is deposited. This hard alloy cutting tool is deficient in that the wear resistance is inadequate due to inter-diffusion of WC and Co from the surface layer into the first TiC coating. The reason recited for using the first layer of TiC is that when TiC is applied directly to the Co-enriched surface layer, alloying occurs in the enriched layer.

In the following section, research studies for increasing the Co content of the surface layer will be reviewed. A representative example is U.S. Pat. No. 4,911,989 (corresponding JPA, First Publication No. Hei 63(1988)-No.197,569). U.S. Pat. No. 4,911,989 discloses a surface-coated and cemented carbide substrate in which the hardness of the cemented carbide substrate, in the range of 2–5 μm from the interface between the coating layer and substrate, is 700–1300 kg/mm$^2$ by Vicker's hardness (claim 1). The above noted hardness is less than on the inside of the cemented carbide substrate. The above noted U.S. Pat. No. 4,911,989 further discloses that: the cemented carbide substrate, wherein the quantity of the Co in the cemented carbide substrate, in the range of 2–20 μm to 50–100 μm from the interface, is 1.5 to 7 times by weight greater than the average quantity of the Co (claim 5).

In this patent application, the fourth embodiment shows a substrate material made of a powdered mixture, WC-2% TiCN-3% TaC-5.6% Co. which is heated in a vacuum to 1400° C., held for 30 minutes and is sintered in a $N_2$ atmosphere at 2 torr, cooled, to 1320° C. at a cooling rate of 10° C./min, and then cooled to 1200° C. in a vacuum ($1\times10^{-3}$ torr) at a cooling rate of 1° C./min, to produce a cemented carbide substrate interface where the quantity of the Co is 3 to 7 times, by weight greater than the average quantity of the Co.

This above-noted cemented carbide substrate has no coating. However, the first embodiment concerns the surface coating of a cemented carbide substrate with the usual CVD TiC coating to this is of 5 μm thick and $Al_2O_3$ coating that is 5 μm thick. The fifth embodiment concerns the surface coating of a cemented carbide substrate with the usual CVD coating TiC (3 μm)/TiN (2 μm)/TiC (1 μm)/$Al_2O_3$ (1 μm). The seventh embodiments concern the surface coating of a cemented carbide substrate with the usual CVD coating TiC (5 μm)/$Al_2O_3$ (1 μm).

However, the technology of the surface-coated hard alloy cutting tool disclosed in U.S. Pat. No. 4,911,989 and U.S. Pat. No. 4,830,930 is deficient because the wear resistance is inadequate, due to the inter-diffusion of WC and Co from the surface layer into the first TiC coating.

The foregoing extensive review of the prior art technologies is given to show that the studies are mostly concerned not with improving the coatings, but with improving the toughness of the surface layer, which provides improved chipping resistance however still left a problem of low wear resistance.

In the following section, research studies for improving the properties of the coatings will be reviewed. Representative examples are U.S. Pat. No. 4,497,874 and U.S. Pat. No. 4,812,370 (corresponding JPA, First Publication, No. Sho 63(1988)- No.89666).

U.S. Pat. No. 4,497,874 discloses a coated hard alloy material having a Co-enriched surface on which a first coating of TiN is deposited. The reason recited for using the first layer of TiN instead of the usual coating of TiC is if TiC coating is applied directly to the Co-enriched surface layer, alloying occurs in the enriched layer. Therefore, the first TiN coating is used to prevent such alloying, and to form a thick layer of TiC without resorting to forming a gradation layer.

In the first embodiment of the above-noted patent, a method is disclosed for preparing a substrate material of WC-6% TaC-6% Co-5% ($W_{0.5}Ti_{0.5}$)C, according to the following steps: preparing pressed compacts and dewaxing at 1260° C.; heating the dewaxed compacts in a $N_2$ atmosphere and flowing rate of 3 l/min for 45 minutes; removing the nitrogen and raising the temperature to 1445° C., and sintering the compacts for 100 minutes; to produce a substrate material having a Co-enriched 30 μm thick surface layer in which there is no B-1 type hard phase. The hard alloys are produced by coating the substrate material with TiN/TiC/TiN or with $Al_2O_3$.

U.S. Pat. No. 4,812,370 (JPA No. Sho63(1988)-No.89666) discloses in the claims, a coated hard alloy having a Co-enriched surface layer on which a WC and Co-diffused TiC first coating is deposited, a TiCN/TiN second coating to prevent the diffusion of WC and Co, a third coating of pure TiC, and a fourth coating, such as TiCO, TiCNO and $Al_2O_3$.

The preferred embodiments of the above-noted application disclose, a coated hard alloy material of WC-12.4% ($Ti_{0.46}Ta_{0.22}W_{0.32}$)($C_{0.80}N_{0.20}$)-8.0% Co, having a Co-enriched surface layer of an 18 μm thickness, and having a 3 μm thick TiC coating with diffused WC and Co, 2 μm of TiCN, 2 μm TiC and 0.3 μm $Al_2O_3$ coating.

The foregoing technologies are aimed at solving the problems of the chipping of hard alloys when a CVD coating is applied directly to the Co-enriched surface layer of a substrate material, causing the formation of undesirable microstructures such as pores and a brittle eta phase in the surface layer, due to the diffusion of WC and Co from the substrate. The TiC coatings with diffused WC and Co also suffer from poor wear resistance.

Even though the step of decarburizing disclosed in claims 11, 12 and 15 of U.S. Pat. No. 4,497,874 may be applied before the first coating of TiN is applied to the substrate material, the hard alloy produced according to this patent still presents problems such as the poor adhesion of the first coating TiN to the substrate material. And the wear resistance of said hard alloy produced according to this patent is not significantly improved because the primary coating is TiC.

The technology disclosed in U.S. Pat. No. 4,812,370 (corresponding JPA No. Sho 63(1988)- No.89666) is also deficient in that the wear resistance is inadequate because of inter-diffusion of WC and Co from the surface layer into the first TiC coating.

To rectify such problems in the existing coated hard alloys as outlined above, the present invention presents a new technology for preparing a coated hard alloy cutting tool of high toughness and high resistance to wear and chipping.

SUMMARY OF THE INVENTION

The objective of the present invention is to present a coated hard alloy cutting tool of high toughness and high resistance to wear and chipping, in which the surface layer of the substrate material is free of pores and a brittle phase, and is adhered tightly to the coatings applied thereon.

The present invention concerns a coated hard alloy cutting tool comprising a plurality of hard coatings formed on the surfaces of a primarily WC substrate material containing Co, and consisting essentially of a core and multiple surface layers.

A Co-enriched surface layer occurs within a surface layer region of 50 μm from an interface of said substrate material, wherein the Co content in a surface layer of 5–10 μm thickness from an interface of said substrate material is within a range from 15–25% by weight, wherein the Co content in said surface layer is more than the Co content in said core, wherein the content of the carbides of Ti, Ta, and Nb is lower than that in said core, and wherein the plurality of surface coatings consist of a primary coating of TiCN deposited on the surface layer, a secondary coating of $Al_2O_3$ deposited on the primary coating, and a surface coating consisting of at least one coating of TiCN and TiN deposited on the secondary coating of $Al_2O_3$.

A surface region within a distance of 100 μm to 400 μm from said interface between coatings and substrate material is substantially free of said free carbon particles, while free carbon particles are present in a region of said core located beyond 100–400 μm from said interface of said substrate material.

The Co content in a region of said core located substantially beyond 100 μm depth from said interface of said substrate material is within the range from 4–8% by weight. The proportion of a carbide of Ti, Ta and Nb at the surface layer of 5–10 μm thickness from said interface of said substrate material is lower than that in the core portion at a depth of 100 μm of said substrate material.

The coatings of the present invention are deposited at relatively low temperatures, and a relatively high concentration of Co in the surface layers. Therefore, compared with the existing coated cutting tools, residual tensile stresses in the as-deposited coating layers are held relatively low, between not more than 20 $Kg/mm^2$. The low residual stress level in the coatings is a reason for high chipping resistance of the cutting tools of the present invention.

The interface (which is also the internal surface of the substrate material) between the substrate material and the primary coating of TiCN is provided with a first intermediate coating of TiN to lower the residual stress of the primary coating of TiCN. The thickness of the first intermediate coating of TiN (between the substrate interface and the primary coating TiCN) is also preferably less than 1 μm.

Between the primary coating and the secondary coating, a second intermediate coating, consisting of at least one layer of a TiC layer, TiCO layer or TiCNO layer, is provided so as to improve the adhesion of the coatings. The thickness of the second intermediate coating of TiCO or TiCNO layer that are preferably less than 1 μm thickness.

However, the coated hard alloy cutting tool that has coated directly on the surface of the substrate material will still poor adhesion between the coating layer and the substrate material. Accordingly, a barrel finishing, a shot blasting and/or acid dipping is applied to the surface of the substrate material after sintering, to solve the above noted problem.

Other variations of the basic invention includes the following variations.

The chipping resistance is improved further in the present invention by treating the as-deposited coatings so as to adjust the magnitude and type of residual stresses in the coatings. In some cases, the tensile residual stresses in the coating can be converted into compressive residual stresses. This is accomplished in the following way.

Shot peening is employed in the present invention to effectively control the magnitude and type of residual stresses in the shot peened coatings and underlying coating. By this processing, the tensile residual stress level is lowered to not more than 10 $Kg/mm^2$, and by varying the peening conditions, it is possible to convert tensile stresses into compressive stresses of not more than 20 $Kg/mm^2$.

By impacting the surfaces of the coated alloy with steel balls thereby lowering the tensile residual stresses therein, chipping resistance of the coated alloy is increased. However, wear resistance is lowered in some cases. Therefore, the shot peening process is applied locally to parts of the cutting tool, for example to the rake surfaces, so that the residual tensile stresses in the primary coating thereon are lower than those tensile residual stresses in the primary coating on the flank surfaces of the cutting tool.

Further shot peening treatment is applied so that the residual stresses in the primary coating of the rake surfaces of the cutting tool are compressive, and that the residual stresses in the primary coating of the flank surfaces are tensile.

It is effective to treat only the rake surfaces, such a procedure is also more economical for production purposes also. By so doing, chipping resistance of the coated alloy increases, and lowering in wear resistance becomes rare.

Also in the above-noted structures of cutting tools also, the residual tensile stresses in the primary coating can be made to be not more than 20 $Kg/mm^2$. This value can be further controlled with the application of shot peening to not more than 10 $Kg/mm^2$. With further peening, it is even possible to convert the tensile residual stresses in the primary coating to compressive residual stresses, and to control the value of the compressive residual stresses so that it is not more than 20 $Kg/mm^2$.

BRIEF DESCRIPTION OF THE DRAWINGS

FIG. 8 shows a relationship between the Co concentration and the distance from the interface of the substrate material in some samples.

DETAILED DESCRIPTION OF THE PREFERRED EMBODIMENTS

Basic Configurations

Figure 1:
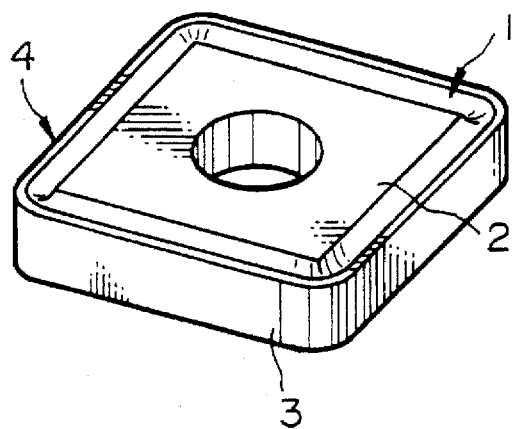
FIG. 1 is an illustration of an example of application of the present invention to making of an insert.

FIG. 1 is an example of applying the technique of preparing the coated hard alloy material of the invention to an insert. A square-shaped insert body 1 has a rake surface 2 on each of the top and bottom surfaces, and the flank surfaces 3 are formed on the side surfaces thereof, forming cutting edges 4 at the intersections of the top and bottom surface with the side surfaces. The insert body 1 comprises a substrate material and various coatings to be described later.

In this embodiment, a square shape is illustrated, but the invented structural configuration is equally applicable to other shapes such as triangles, parallelpipeds, rhomboids and circles.

Figure 2:
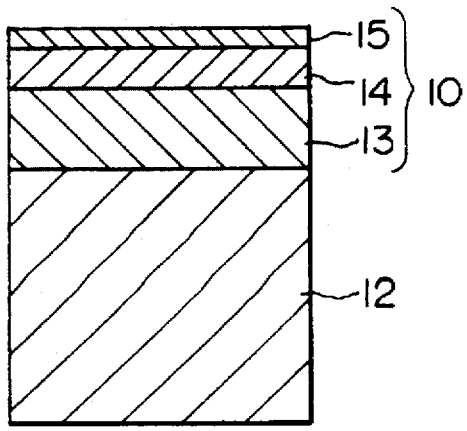
FIG. 2 is a cross sectional view of the coating configuration of a first embodiment of the insert shown in FIG. 1.

FIG. 2 is a first embodiment of the coating layer configuration of the invention. The coating layer 10 of this embodiment is formed on a substrate material 12, and consists of a primary coating 13, a secondary coating 14 and a surface coating 15.

Figure 3:
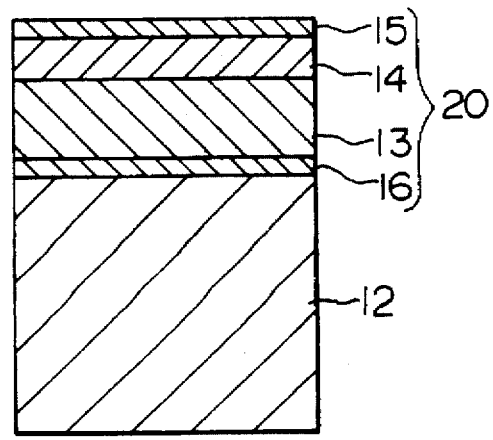

FIG. 3 is a second embodiment of the coating layer configuration of the invention. The coating layer 20 of this embodiment is formed on the interface of the substrate material 12, and consists of a first intermediate coating 16, the primary coating 13, the secondary coating 14 and the surface coating 15.

Figure 4:
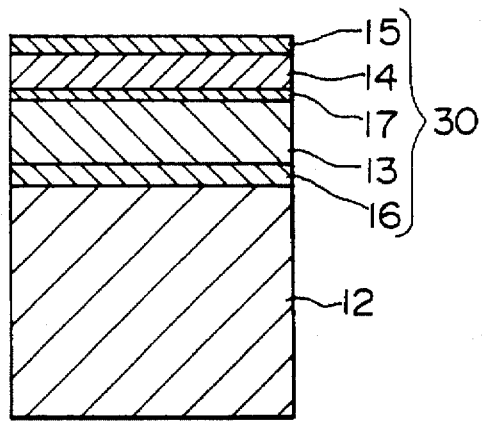
FIG. 4 is a cross sectional view of the coating configuration of a third embodiment of the insert shown in FIG. 1.

FIG. 4 is a third embodiment of the coating layer configuration of the invention. The coating layer 30 of this embodiment is formed on the interface of the substrate material 12, and consists of a first intermediate coating 16, the primary coating 13, a second intermediate coating 17, the secondary coating 14 and the surface coating 15.

Figure 5:
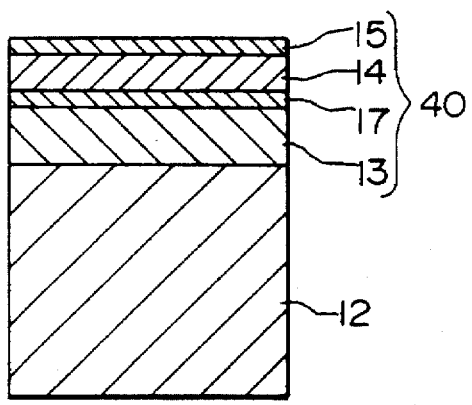
FIG. 5 is a cross sectional view of the coating configuration of a fourth embodiment of the insert shown in FIG. 1.

FIG. 5 is a forth embodiment of the coating layer configuration of the invention. The coating layer 40 of the embodiment is formed on the interface of the substrate material 12, and consists of the primary coating 13, the second intermediate coating 17, the secondary coating 14 and the surface coating 15.

Figure 6:
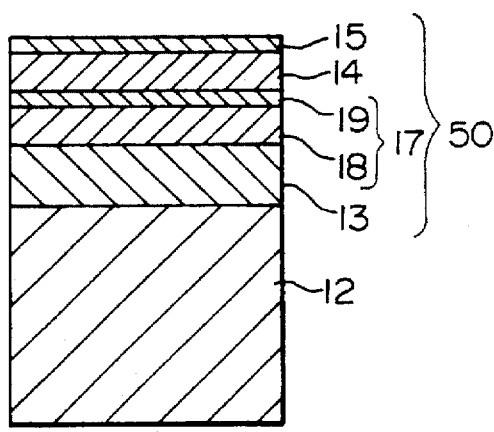
FIG. 6 is a cross sectional view of the coating configuration of a fifth embodiment of the insert shown in FIG. 1.

FIG. 6 is a fifth embodiment of the coating layer configuration of the invention. The coating layer 50 of the embodiment is formed on the interface of the substrate material 12, and consist of the primary coating 13, the second intermediate coating 17, the secondary coating 14 and the surface coating 15. The second intermediate coating 17 consists of a primary intermediate coating 18 and a secondary intermediate coating 19.

Figure 7:
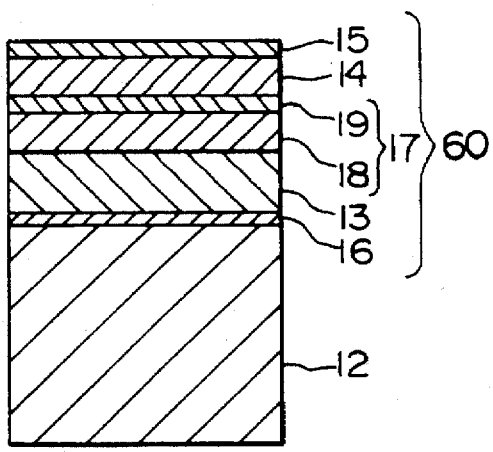
FIG. 7 is a cross sectional view of the coating configuration of a sixth embodiment of the insert shown in FIG. 1.

FIG. 7 is a sixth embodiment of the coating layer configuration of the invention. The coating layer 60 of the embodiment is formed on the interface of the substrate material 12, and consist of the first intermediate coating 16, the primary coating 13, the second intermediate coating 17, the secondary coating 14 and the surface coating 15. The second intermediate coating 17 consists of a primary intermediate coating 18 and a secondary intermediate coating 19.

The substrate material 12 has WC as its primary constituent, with Co added as a binder, but may contain other additives such as B-1 type hard phases comprising carbides, nitrides and/or carbonitrides of Ti, Ta and Nb containing W, and unavoidable impurities. However, the essential conditions are that the Co-enriched surface layer occurs within a surface layer region of 50 μm from an interface of said substrate material, wherein the Co content in a surface layer that is 5–10 μm thickness from an interface of said substrate material is within a range from 15–25% by weight; wherein the Co content in said surface layer is more than the Co content in said core; and wherein the content of the carbides of Ti, Ta and Nb is lower than that in said core. In addition, another essential condition is that the Co content in the region of said core located beyond about 100 μm depth from said interface of said substrate material is within the range from 4–8% by weight.

A surface region within a distance of 100 μm to 400 μm. from said interface between coatings and substrate material is substantially free of said free carbon particles, while free carbon particles are present in a region of said core located beyond 100–400 μm from said interface of said substrate material.

The primary coating 13 is composed of a TiCN layer, the secondary coating 14 is composed of a $Al_2O_3$ layer, and the surface coating 15 is composed of either or both of a TiCN layer and a TiN layer. The first intermediate coating 16 is composed of a TiN layer and the second intermediate coating is composed of at least one of the layers of TiC, TiCO and TiCNO.

The procedure for preparing the substrate material 12 will be described in the following. A powder mixture corresponding to the desired composition of the substrate material 12 is prepared. This powder mixture is mixed with binders and additives, as necessary, and the mixture is ball-milled and dried to obtain a powder material. The powder material which can be used in preparing the raw material includes any one or a plurality of the elements in Group 4a, Group 5a and Group 6a; or carbides, nitrides and carbonitrides of Group 4a, Group 5a and Group 6a elements as well as other known elements or compounds generally used in hard alloy materials, such as powdered materials of WC, (W,Ti)C, (Ta,Nb)C, Co and graphite.

Next, the powdered material is press compacted into green compacts, which are sintered in a reduced pressure furnace at around 1400° C. to produce a substrate material which has a core that contains free carbon particles but whose surface layer of 100–400 μm depth is substantially free of free carbon particles.

The free carbon particles are precipitated as black particles in the body of the substrate material during carburizing, but in this invention this precipitation is controlled to occur in the core at the depth of 100–400 μm, which is referred to as the core zone. In other words, the precipitation depth closest point to the surface is 100 μm, and the farthest depth is 400 μm.

Such microstructural changes can be observed readily with an optical microscope, because the carbides of the above mentioned elements are etched black in the metallographic specimen preparation.

The surfaces of the sintered compacts are processed by such means as honing, and CVD coatings deposited at relatively low temperature thereon to produce coated hard alloy having the surface layer with high Co content (15–25%) inserts of the invention. In depositing such coatings, the residual stresses in the as-deposited coatings are tensile, whose value is less than 20 Kg/mm$^2$.

After the coatings are applied, the residual stresses in the coatings can be adjusted by means of shot peening. By adjusting the peening parameters, the residual stresses can be lowered from tensile residual stress of 20 Kg/mm$^2$ to less than 10 Kg/mm$^2$. The stress type can also be altered from a tensile to a compressive type. In practice, in the case of steel balls, the speed is in a range of 50–70 m/s, and the peening time of 60–90 seconds to obtain the range of stresses mentioned above.

First Preferred Embodiment and Processing Steps

WC powder of 3.5 μm average diameter, $(W_{0.58}Ti_{0.42})C$ powder of 1.5 μm average diameter, $(Ta_{0.83}Nb_{0.17})C$ powder of 1.4 μm average diameter, Co powder of 1.2 μm average diameter, were blended into a mixture having a composition, WC-8% $(W_{0.58}Ti_{0.42})$C-5.5% $(Ta_{0.83}Nb_{0.17})$C-5.5% Co, all by weight, to which 0.08% graphite powder was added, and the entire mixture was wet-milled for 72 hours in a ball-mill, and dried. Green pressed compacts were made in accordance with ISO CNMG120408 using a press at 15 Kg/mm$^2$. The green pressed compacts were sintered in a vacuum of $1\times10^{-2}$ torr at 1410° C. for one hour. Samples of hard alloy substrate material, which were basically free of free carbon particles were thus produced.

These samples were carburized in a gas mixture of $H_2$(80%)-$CH_4$(20%, all by volume) at a reduced pressure of 10 torr, at 1400° C., for one hour, and cooled to room temperature at a cooling rate of 2.5° C./min. This one group of samples of the hard alloy substrate material, is has a denuded zone of 150 μm depth which is basically free of free carbon particles and has a core zone of over 150 μm depth which has free carbon particles when viewed under optical microscope.

The cutting edges were prepared by honing the surface to a depth of 0.07 mm on the rake surface and to a depth of 0.04 mm on the flank surfaces.

These hard alloy samples were given a shot-blasting treatment by air pressure at 5 kg/cm$^2$, with a #1000 $Al_2O_3$ powder, followed by submersion of the samples in a 0.3% nitric acid solution for 10 minutes. The coatings were applied under the conditions shown in Table 1 to produce coated hard alloy cutting insert samples 1 to 12 (hereinbelow termed samples) listed in Table 2.

Figure 8:
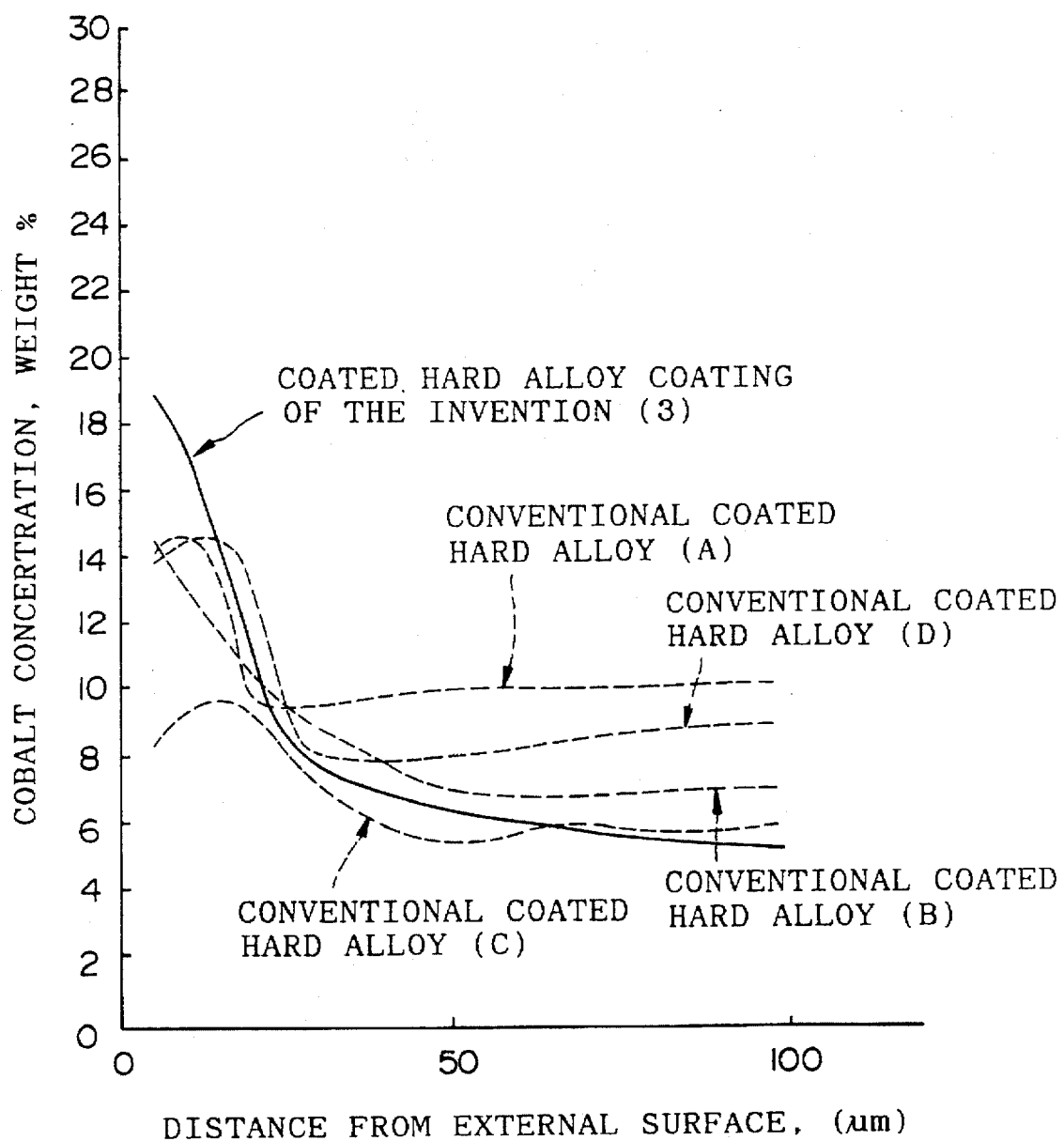
FIG. 8 is a cross sectional view of the coating configuration of a second embodiment of the insert shown in FIG. 1.

The profiles of the concentration gradient of Co in the coated hard alloy insert samples are shown in FIG. 8. These results were obtained by energy dispersive X-ray spectroscopy in a 4×26 μm area under a scanning electron microscope at a magnification of 5,000. The measurements were repeated five times at a designated depth to obtain an average value.

In these samples, the residual stress values in the primary TiCN coating determined by a X-ray technique are as shown in Table 2.

A part of the coated samples was subjected to shot peening using 0.3 mm diameter steel shot at a speed of 50 m/s for 60 seconds, to produce the coated samples of the present invention shown in Table 2. The residual stresses in the TiCN coating were also measured, as reported In Table 2.

By this kind of process, a substrate material was obtained in which the Ti content was 0.9%, the Ta content was 1.6% and the Nb content was 0.2% at a depth 10 μm, and in which the Ti content was 2.0%, the Ta content was 4.6% and the Nb content was 0.5% at a depth of 100 μm. Accordingly, the B-1 type hard phase content at the surface of said substrate material was less than the hard phase content of the internal portion of the substrate material.

For comparative evaluation purposes, samples A shown in Table 2 were produced, according to the process disclosed in U.S. Pat. No. 4,277,283 (JPA, First Publication No. Sho 54(1979)- No.87719). These samples were produced for comparative evaluation by blending starting materials from powdered particles of: WC-6.3% $(Ti_{0.75}W_{0.25})(C_{0.68}N_{0.32})$-7.5% $(Ta_{0.75}Nb_{0.25})$C-10.5% Co, with 0.26% graphite, and by pressing the powder to produce green pressed compacts. They were sintered at 1380° C. in a vacuum of $1\times10^{-3}$ torr to produce samples of a substrate material having essentially free carbon particles. The samples were treated by honing and a 6 μm thick coating of TiC was deposited thereon using the same procedure as the first embodiment to produce sample A for comparative evaluation.

The profiles of Co distribution in the surface layer of the substrate material were as shown in FIG. 8, indicating that the thickness of the B-1 phase denuded zone was 19 μm and that the substrate material had essentially no Ti, Ta and Nb at the depth of 10 μm from the surface of said substrate material.

Additional samples were produced for comparative evaluation according to the first embodiment disclosed in JPA, First Publication No. Sho 63(1988)- 169,356.

The substrate material of this disclosed embodiment was WC-5% TiC-7% Co, and after blending the materials and pressing to produce green pressed compacts, they were sintered at 1380° C. for 1 hour, in a vacuum. They were then carburized in a gas mixture of $H_2$ (80%)-$CH_4$ (20%, by volume) at a reduced pressure of 20 torr, and subsequently decarburized at 1310° C., for 2 minutes, in a gas mixture of $H_2$ (90%)-$CO_2$ (10%, all by volume), and cooled to room temperature in a vacuum.

The substrate material thus produced was treated by honing and a coating of TiC was deposited by the same procedure as in the first embodiment to produce sample B with a 5 μm thick coating of TiC. The profile of the Co distribution was as shown in FIG. 8, indicating that the B-1 type hard phase was present in the surface layer and in the core zone. The Ti content of the substrate material was 4.5% by weight at a depth of 10 μm, and 5.1% at a depth of 100 μm depth.

Also for comparative purposes, coated hard alloy insert sample C was prepared in the same way as disclosed in Example 1 of U.S. Pat. No. 4,497,874.

This sample for comparative evaluation was produced by mixing the starting material from powdered particles of: WC-5% $(W_{0.5}Ti_{0.5})$C-6% TAG-6% Co, with 0.08% graphite. This mixture was then press compacted, dewaxed and sintered at 1260° C. with flowing nitrogen, at a rate of 3 l/min, at a reduced pressure of 600 torr. After 45 minutes of heating, the nitrogen was removed and sintering was performed at 1445° C. for 100 minutes in a reduced-pressure argon atmosphere of 2 torr. The surfaces of the sample were honed as before, and a multilayer coating consisting of TiN (1.5 μm)-TiC (8 μm)-$Al_2O_3$(2 μm).

The thickness of the B-1 phase denuded zone was 28 μm, and the presence of free-carbon particles was noted. This sample had essentially no Ti, Ta at a depth of 10 μm.

In addition sample D was produced for comparative evaluation in accordance with the first embodiment in the U.S. Pat. No. 4,610,931.

The substrate material of this disclosed embodiment was WC-10.3% TAC-5.85% TiC-0.2% NbC-1.5% TiN-8.5% Co, to which 0.1% graphite powder was added, and after blending the materials and pressing to produce green pressed compacts, they were sintered at 1496° C., for 30 minutes, in a vacuum. There after, only the rake surfaces (top and bottom surfaces) were ground. The sample was then vacuum-heated at 1427° C., for 1 hour, in a vacuum of 100

μmHg, cooled, at a rate of 56° C./min, to 1204° C.; and cooled to room temperature in a vacuum. The flank surfaces were then ground, and a CVD coating TiC (5 μm)/TiCN (4 μm)/TiN (1 μm) was deposited thereon. The profile of the Co distribution is as shown in FIG. 8, indicating that the thickness of the denuded B-1 phase zone was 20 μm, and that this sample had essentially no Ti, Ta at a depth of 10 μm.

All of these samples produced for comparative evaluation were subjected to X-ray residual stress determinations.

TABLE 1

| Coating | | Gas Composition (volume %) | Reaction T (°C.) |
|---|---|---|---|
| TiCN (for primary coating) | $TiCl_4$ | 1.5 | 860 |
| | $CH_3CN$ | 0.5 | |
| | $N_2$ | 25 | |
| | $H_2$ | remainder | |
| $Al_2O_3$ | $AlCl_3$ | 5.0 | 1020 |
| | $CO_2$ | 8.0 | |
| | $H_2$ | remainder | |
| TiCN (for surface coating) | $TiCl_4$ | 2 | 1020 |
| | $CH_4$ | 5 | |
| | $N_2$ | 20 | |
| | $H_2$ | remainder | |
| TiC | $TiCl_4$ | 2 | 1020 |
| | $CH_4$ | 5 | |
| | $H_2$ | remainder | |
| TiN | $TiCl_4$ | 2 | 1020 |
| | $N_2$ | 30 | |
| | $H2$ | remainder | |
| TiCO | $TiCl_4$ | 2 | 1020 |
| | CO | 6 | |
| | $H_2$ | remainder | |
| TiCNO | $TiCl_4$ | 2 | 1020 |
| | CO | 3 | |
| | $N_2$ | 3 | |
| | $H_2$ | remainder | |

Next, machining tests were carried out using the samples of the present invention as well as those of the comparative evaluation thus produced. Continuous machining tests:
  Material machined: a cylinder of JIS SCM440 (HB 200)
  Machining speed: 220 m/min
  Feed rate: 0.35 mm/rev.
  Depth of Cut: 2.0 mm
  Machining duration: 30 minutes
  Lubricant: water soluble
Interrupted machining tests:
  Material machined: a square cylinder of JIS SNCM439 (HB 270)
  Machining speed: 100 m/min
  Feed rate: 0.375 mm/rev.
  Bite: 3.0 mm
  Lubricant: Done In continuous machining, the wear of the rake surface was measured, and in interrupted machining, the resistance to chipping was evaluated by the time until the occurrence of the first chipping event.

TABLE 2

| Test No. | Coating | Peening | Residual Stress (Kg/mm²) | Wear Width (mm) | Chipping Time (min) |
|---|---|---|---|---|---|
| 1 | TiCN(9.5)-$Al_2O_3$(2)-TiN(1) | None | TiCN/15T | 0.28 | 18.9 |
| 2 | TiCN(6)-TiC(3.5)-$Al_2O_3$(2)-TiN(1) | None | TiCN/14T | 0.27 | 18.1 |
| 3 | TiCN(9.5)-TiCNO(0.3)$Al_2O_3$(2)-TiCN(1)TiN(1) | None | TiCN/14T | 0.25 | 18.9 |
| 4 | TiCN(6)-TiC(3.5)-TiCNO(0.3)-$Al_2O_3$(2)-TiN(1) | None | TiCN/16T | 0.23 | 18.1 |
| 5 | TiN(0.5)-TiCN(9)-TiCNO(0.3)-$Al_2O_3$(2)-TiCN(1)-TiN(1) | None | TiCN/13T | 0.24 | 18.7 |
| 6 | TiCN(9.5)-Al2O3(2)-TiN(1) | All Surfaces | TiCN/4T | 0.30 | 21.8 |
| 7 | TiCN(9.5)-TiCNO(0.3)-$Al_2O_3$(2)-TiN(1) | All Surfaces | TiCN/2T | 0.27 | 21.7 |
| 8 | TiCN(9.5)-TiCNO(0.3)$Al_2O_3$(2)-TiN(1) | Rake Surface | TICN/rake/2T flank/14T | 0.24 | 21.7 |
| 9 | TiCN(6)-TiC(3.5)-TiCNO(0.3)$Al_2O_3$(2)-TiN(1) | Rake Surface | TiCN/rake/3T flank/16T | 0.23 | 21.0 |
| 10 | TiN(0.5)-TiCN(9)-TiCNO(0.3)-$Al_2O_3$(2)-TiCN(1)-TiN(1) | All Surface | TiCN/4C | 0.26 | 21.5 |
| 11 | TiN(0.5)-TiCN(9)-TiCNO(0.3)-$Al_2O_3$(2)-TiCN(1)TiN(1) | Rake Surface | TiCN/rake/3C flank/13T | 0.23 | 21.6 |
| 12 | TiN(0.5)-TiCN(6)-TiC(3)-TiCNO(0.3)-$Al_2O_3$(2)-TiCN(1)TiN(1) | Rake Surface | TiCN/rake/2T flank/15T | 0.23 | 21.1 |
| A | TiC(6.0)- | None | TiC/35T | 0.68 in 6 min | 6.7 |
| B | TiC(5)- | None | TiC/33T | 0.63 in 8 min | 7.2 |
| C | TiN(1.5)-TiC(8)-$Al_2O_3$(2) | None | TiC/31T | 0.58 in 14 min | 3.8 |
| D | TiC(5)-TiCN(4)-TiN(1)- | None | TiCN/30T | 0.54 in 10 min | 7.0 |

Notes: In Table 2, various abbreviations are as follows:
TiCN(9.5) indicates a TiCN coating of 9.5 μm thickness.
TiCN/15T indicates a tensile residual stress value of 15 Kg/mm² measured on a TiCN coating.
TiCN/rake/3C flank/13T indicates residual stress values of that are compressive residual stress of 3 Kg/mm² measured on a rake surface, and a tensile residual stress of 13 kg/mm² measured on flank surfaces of TiCN coating.

The results shown in Table 2 demonstrate clearly that the coated hard alloy insert according to the present invention are far superior to those made by the comparative methods. The performance parameters, wear resistance and chipping tendencies are greatly improved over the conventionally prepared cutting tools.

The coated cutting tool of the present invention is characterized by a Co concentration gradient in the Co-enriched surface layer such that the Co-enriched surface layer occurs within a surface layer region of 50 μm from an interface of said substrate material, wherein the Co content in a surface layer of 5–10 μm thickness from an interface of said substrate material is within a range from 15–25% by weight; wherein the Co content in said surface layer is more than the Co content in said core; wherein the content of the carbides of Ti, Ta and Nb is lower than that in said core said surface region within a distance of 100 μm to 400 μm from said interface between said coatings and said substrate material is substantially free of said free carbon particles, while free carbon particles are present in a region of said core located beyond 100–400 μm from said interface of said substrate material; and wherein the plurality of surface coatings consist of a primary coating of TiCN deposited on the surface layer, a secondary coating of $Al_2O_3$ deposited on the primary coating, and a surface coating consisting of at least one coating of TiCN and TiN deposited on the secondary coating of $Al_2O_3$.

The Co content in a region of said core located beyond approximately 100 μm in depth from said interface of said substrate material is within the range of 4–8% by weight.

The primary coating on the invented cutting tool is TiCN, and is made by reacting titanium tetrachloride with acetonitrile at the relatively low temperatures of 840°–900° C., compared to 1000° to 1050° C. of the conventional technique.

Therefore, there is less diffusion of the elements constituting the substrate material, such as WC and Co, into the coating, and there is less tendency to form detrimental microstructural phases, such as pores and the brittle phases (eta phase), thereby improving the bonding of the primary coating TiCN to the substrate material.

The technique of depositing a coating on a substrate material with the use of $TiCl_4$ and acetonitrile is disclosed as an example in JPA, First Publication No. Sho 50 (1975)-No.117809, but the substrate material has a composition, WC-22% (TiC+TaC)-9.5% Co, but has neither a Co-enriched surface nor a B-1 phase denuded zone, and is a typical conventional material which did not come into general use.

The present coatings, composed of primarily TiCN, are far superior to such materials because they are produced at relatively low deposition temperatures, and are deposited on a substrate material having a Co-enriched surface layer and a core, wherein said Co-enriched surface layer occurs within a surface layer region of 50 μm from an interface of said substrate material, wherein the Co content in a surface layer of 5–10 μm from an interface of said substrate material is within a range from 15–25% by weight, wherein the Co content in said surface layer is more than the content in said core, and wherein the content of the carbides of Ti, Ta and Nb is lower than that in the core. The surface region within a distance of 100 μm to 400 μm from said interface is substantially free of said free carbon particles, while free carbon particles are present in a region of said core located beyond 100–400 μm from said interface of said substrate material.

It is generally known that in forming deposits by thin film forming techniques, such as CVD, residual tensile stresses are generated in the coating (TiC) because of the differences in the thermal coefficient of expansion between the coating layer and substrate material. The values of such residual stresses differ among the coatings, depending on the coating thickness, and the composition of both coatings and substrate materials.

In the substrate material containing less than 10% Co. residual tensile stresses in a range of 30 to 60 Kg/mm² are reported to be present (Journal of the Japan Institute of Metal, v. 50, No. 3, pp320–327, 1986).

In Table 2, it can be seen that the tensile residual stresses of the conventional materials all exceed 30 Kg/mm². However, in the present invention, coating layers are deposited at relatively low temperatures and a relatively high concentration of Co in the surface layers. Therefore, compared with the existing coated cutting tools, residual tensile stresses in the as-deposited coating layers are held relatively low, not more than 20 Kg/mm². The low residual stress level in the coatings is a reason for high chipping resistance of the cutting tools of the present invention. Therefore it was found that in the present invention, the residual stresses can be decreased, and by selecting the peening conditions, tensile stresses in the deposited coatings can be converted to compressive residual stresses.

What is claimed is:

1. A coated hard alloy cutting tool, comprising:

a substrate comprising WC and Co, said substrate has a Co enriched surface layer of 50 μm from the external surface of said substrate and a core, the Co concentration of a region that is 5–10 μm from the external surface is from 15–25 wt %, the Co content of said surface layer is more than that of said core, the content of carbides of Ti, Ta and Nb in the surface layer is lower than the content of said core; and at least one coating deposited on said surface of said substrate, said coating, sequentially consists of:
  (a) a primary layer comprising a TiCN layer;
  (b) a secondary layer comprising an $Al_2O_3$ layer; and
  (c) a surface layer comprising at least one layer selected from the group consisting of a TiCN layer and a TiN layer;

wherein said primary layer is produced so that tensile residual stresses therein are not more than 20 Kg/mm²; and wherein said layers (a)–(c) are deposited by chemical vapor deposition.

2. A coated hard alloy cutting tool as claimed in claim 1, wherein a surface region within a distance of 100 μm to 400 μm from said external surface is substantially free of free carbon particles, while free carbon particles are present in a region of said core located beyond 100–400 μm from said external surface of said substrate.

3. A coated hard alloy cutting tool as claimed in claim 1, wherein the Co content in a region of said core located beyond about a depth of 100 μm from said external surface of said substrate is within the range of from 4–8% by weight.

4. A coated hard alloy cutting tool as claimed in claim 1, wherein said substrate is provided with rake surfaces and flank surfaces, wherein the tensile residual stresses in said primary layer on said rake surfaces are not greater than tensile residual stresses in said primary layer on said flank surfaces.

5. A coated hard alloy cutting tool, comprising:

a substrate comprising WC and Co, said substrate has a Co enriched surface layer of 50 μm from the external surface of said substrate and a core, the Co concentration of a region that is 5–10 μm from the external surface is from 15–25 wt %, the Co content of said surface layer is more than that of said core, the content of carbides of Ti, Ta and Nb in the surface layer is lower than the content of said core; and at least one coating deposited on said surface of said substrate, said coating, sequentially consists of:
(a) a primary layer comprising a TiCN layer;
(b) a secondary layer comprising an $Al_2O_3$ layer; and
(c) a surface layer comprising at least one layer selected from the group consisting of a TiCN layer and a TiN layer;

wherein said substrate is formed with rake surfaces and flank surfaces;

wherein said primary layer on said rake surfaces is treated to produce compressive residual stresses of not more than 20 Kg/mm$^2$;

wherein said primary layer on said flank surfaces is produced so that tensile residual stresses therein are not more than 20 Kg/mm$^2$; and wherein said layers (a)–(c) are deposited by chemical vapor deposition.

6. A coated hard alloy cutting tool, comprising:

a substrate comprising WC and Co, said substrate has a Co enriched surface layer of 50 μm from the external surface of said substrate and a core, the Co concentration of a region that is 5–10 μm from the external surface is from 15–25 wt %, the Co content of said surface layer is more than that of said core, the content of carbides of Ti, Ta and Nb in the surface layer is lower than the content of said core; and at least one coating deposited on said surface of said substrate, said coating, sequentially consists of:
(d) a first intermediate layer comprising a TiN layer;
(a) a primary layer comprising a TiCN layer;
(b) a secondary layer comprising an $Al_2O_3$ layer; and
(c) a surface layer comprising at least one layer selected from the group consisting of a TiCN layer and a TiN layer;

wherein said primary layer is produced so that tensile residual stresses therein are not more than 20 Kg/mm$^2$; and wherein said layers (a)–(d) are deposited by chemical vapor deposition.

7. A coated hard alloy cutting tool as claimed in claim 6, wherein a surface region within a distance of 100 μm to 400 μm from said external surface is substantially free of free carbon particles, while free carbon particles are present in a region of said core located beyond 100–400 μm from said external surface of said substrate.

8. A coated hard alloy cutting tool as claimed in claim 6, wherein the thickness of said first intermediate layer is not more than 1 μm.

9. A coated hard alloy cutting tool as claimed in claim 6, wherein the Co content in a region of said core located beyond about 100 μm depth from said external surface of said substrate is within the range of from 4–8% by weight.

10. A coated hard alloy cutting tool as claimed in claim 6, wherein said substrate is provided with rake surfaces and flank surfaces, and wherein said primary layer on said rake surfaces is provided with tensile residual stresses which are not greater than tensile residual stresses in said primary layer on said flank surfaces.

11. A coated hard alloy cutting tool, comprising:

a substrate comprising WC and Co, said substrate has a Co enriched surface layer of 50 μm from the external surface of said substrate and a core, the Co concentration of a region that is 5–10 μm from the external surface is from 15–25 wt %, the Co content of said surface layer is more than that of said core, the content of carbides of Ti, Ta and Nb in the surface layer is lower than the content of said core; and at least one coating deposited on said surface of said substrate, said coating, sequentially consists of:
(d) a first intermediate layer comprising a TiN layer;
(a) a primary layer comprising a TiCN layer;
(b) a secondary layer comprising an $Al_2O_3$ layer; and
(c) a surface layer comprising at least one layer selected from the group consisting of a TiCN layer and a TiN layer;

wherein said substrate is formed with rake surfaces and flank surfaces;

wherein said primary layer on said rake surfaces is treated to produce compressive residual stresses of not more than 20 Kg/mm$^2$;

wherein said primary layer on said flank surfaces is produced so that tensile residual stresses therein are not more than 20 Kg/mm$^2$; and wherein said layers (a)–(d) are deposited by chemical vapor deposition.

12. A coated hard alloy cutting tool, comprising:

a substrate comprising WC and Co, said substrate has a Co enriched surface layer of 50 μm from the external surface of said substrate and a core, the Co concentration of a region that is 5–10 μm from the external surface is from 15–25 wt %, the Co content of said surface layer is more than that of said core, the content of carbides of Ti, Ta and Nb in the surface layer is lower than the content of said core; and at least one coating deposited on said surface of said substrate, said coating, sequentially consists of:
(a) a primary layer comprising a TiCN layer;
(e) a second intermediate layer comprising at least one layer selected from the group consisting of a TiC layer, a TiCO layer and a TiCNO layer;
(b) a secondary layer comprising an $Al_2O_3$ layer; and
(c) a surface layer comprising at least one layer selected from the group consisting of a TiCN layer and a TiN layer;

wherein said primary layer is produced so that tensile residual stresses therein are not more than 20 Kg/mm$^2$; and wherein said layers (a)–(c) and (e) are deposited by chemical vapor deposition.

13. A coated hard alloy cutting tool as claimed in claim 12, wherein a surface region within a distance of 100 μm to 400 μm from said external surface is substantially free of free carbon particles, while free carbon particles are present in a region of said core located beyond 100–400 μm from said external surface of said substrate.

14. A coated hard alloy cutting tool as claimed in claim 12, wherein the thickness of said second intermediate layer of a TiCO layer or a TiCNO layer is not more than 1 μm.

15. A coated hard alloy cutting tool as claimed in claim 12, wherein the Co content in a region of said core located beyond about 100 μm depth from said external surface of said substrate is within the range of from 4–8% by weight.

16. A coated hard alloy cutting tool as claimed in claim 12, wherein said substrate is provided with rake surfaces and flank surfaces, wherein said primary layer on said rake surfaces is provided with tensile residual stresses which are not greater than tensile residual stresses in said primary layer on said flank surfaces.

17. A coated hard alloy cutting tool, comprising:
- a substrate comprising WC and Co, said substrate has a Co enriched surface layer of 50 μm from the external surface of said substrate and a core, the Co concentration of a region that is 5–10 μm from the external surface is from 15–25 wt %, the Co content of said surface layer is more than that of said core, the content of carbides of Ti, Ta and Nb in the surface layer is lower than the content of said core; and
- at least one coating deposited on said surface of said substrate, said coating, sequentially consists of:
  - (a) a primary layer comprising a TiCN layer;
  - (e) a second intermediate layer comprising at least one layer selected from the group consisting of a TiC layer, a TiCO layer and a TiCNO layer;
  - (b) a secondary layer comprising an $Al_2O_3$ layer; and
  - (c) a surface layer comprising at least one layer selected from the group consisting of a TiCN layer and a TiN layer;
- wherein said substrate is formed with rake surfaces and flank surfaces;
- wherein said primary layer on said rake surfaces is treated to produce compressive residual stresses of not more than 20 Kg/mm$^2$;
- wherein said primary layer on said flank surfaces is produced so that tensile residual stresses therein are not more than 20 Kg/mm$^2$; and
- wherein said layers (a)–(c) and (e) are deposited by chemical vapor deposition.

18. A coated hard alloy cutting tool, comprising:
- a substrate comprising WC and Co, said substrate has a Co enriched surface layer of 50 μm from the external surface of said substrate and a core, the Co concentration of a region that is 5–10 μm from the external surface is from 15–25 wt %, the Co content of said surface layer is more than that of said core, the content of carbides of Ti, Ta and Nb in the surface layer is lower than the content of said core; and
- at least one coating deposited on said surface of said substrate, said coating, sequentially consists of:
  - (d) a first intermediate layer comprising a TiN layer;
  - (a) a primary layer comprising a TiCN layer;
  - (e) a second intermediate layer comprising at least one layer selected from the group consisting of a TiC layer, a TiCO layer and a TiCNO layer;
  - (b) a secondary layer comprising an $Al_2O_3$ layer; and
  - (c) a surface layer comprising at least one layer selected from the group consisting of a TiCN layer and a TiN layer;
- wherein said primary layer is produced so that tensile residual stresses therein are not more than 20 Kg/mm$^2$; and
- wherein said layers (a)-(e) are deposited by chemical vapor deposition.

19. A coated hard alloy cutting tool as claimed in claim 18, wherein a surface region within a distance of 100 μm to 400 μm from said external surface is substantially free of free carbon particles, while free carbon particles are present in a region of said core located beyond 100–400 μm from said external surface of said substrate.

20. A coated hard alloy cutting tool as claimed in claim 18, wherein the thickness of said first intermediate layer is not more than 1 μm.

21. A coated hard alloy cutting tool as claimed in claim 18, wherein the thickness of said second intermediate layer of a TiCO layer or a TiCNO layer is not more than 1 μm.

22. A coated hard alloy cutting tool as claimed in claim 18, wherein the Co content in a region of said core located beyond about 100 μm depth from said external surface of said substrate is within the range of from 4–8% by weight.

23. A coated hard alloy cutting tool as claimed in claim 18, wherein said substrate is provided with rake surfaces and flank surfaces, and wherein said primary layer on said rake surfaces is provided with tensile residual stresses which are not greater than tensile residual stresses in said primary layer on said flank surfaces.

24. A coated hard alloy cutting tool, comprising:
- a substrate comprising WC and Co, said substrate has a Co enriched surface layer of 50 μm from the external surface of said substrate and a core, the Co concentration of a region that is 5–10 μm from the external surface is from 15–25 wt %, the Co content of said surface layer is more than that of said core, the content of carbides of Ti, Ta and Nb in the surface layer is lower than the content of said core; and
- at least one coating deposited on said surface of said substrate, said coating, sequentially consists of:
  - (d) a first intermediate layer comprising a TiN layer;
  - (a) a primary layer comprising a TiCN layer;
  - (e) a second intermediate layer comprising at least one layer selected from the group consisting of a TiC layer, a TiCO layer and a TiCNO layer;
  - (b) a secondary layer comprising an $Al_2O_3$ layer; and
  - (c) a surface layer comprising at least one layer selected from the group consisting of a TiCN layer and a TiN layer;
- wherein said substrate is formed with rake surfaces and flank surfaces;
- wherein said primary layer on said rake surfaces is treated to produce compressive residual stresses of not more than 20 Kg/mm$^2$;
- wherein said primary layer on said flank surfaces is produced so that tensile residual stresses therein are not more than 20 Kg/mm$^2$; and
- wherein said layers (a)–(e) are deposited by chemical vapor deposition.

25. A coated hard alloy cutting tool as claimed in claim 1, wherein said primary layer is deposited at a temperature of 840°–900° C.

26. A coated hard alloy cutting tool as claimed in claim 5, wherein said primary layer is deposited at a temperature of 840°–900° C.

27. A coated hard alloy cutting tool as claimed in claim 6, wherein said primary layer is deposited at a temperature of 840°–900° C.

28. A coated hard alloy cutting tool as claimed in claim 11, wherein said primary layer is deposited at a temperature of 840°–900° C.

29. A coated hard alloy cutting tool as claimed in claim 12, wherein said primary layer is deposited at a temperature of 840°–900° C.

30. A coated hard alloy cutting tool as claimed in claim 17, wherein said primary layer is deposited at a temperature of 840°–900° C.

31. A coated hard alloy cutting tool as claimed in claim 18, wherein said primary layer is deposited at a temperature of 840°–900° C.

32. A coated hard alloy cutting tool as claimed in claim 24, wherein said primary layer is deposited at a temperature of 840°–900° C.

33. A coated hard alloy cutting tool as claimed in claim 1, wherein said primary layer is deposited by reacting a mixture comprising titanium tetrachloride and acetonitrile.

34. A coated hard alloy cutting tool as claimed in claim 5, wherein said primary layer as deposited by reacting a mixture comprising titanium tetrachloride and acetonitrile.

35. A coated hard alloy cutting tool as claimed in claim 6, wherein said primary layer is deposited by reacting a mixture comprising titanium tetrachloride and acetonitrile.

36. A coated hard alloy cutting tool as claimed in claim 11, wherein said primary layer is deposited by reacting a mixture comprising titanium tetrachloride and acetonitrile.

37. A coated hard alloy cutting tool as claimed in claim 12, wherein said primary layer is deposited by reacting a mixture comprising titanium tetrachloride and acetonitrile.

38. A coated hard alloy cutting tool as claimed in claim 17, wherein said primary layer is deposited by reacting a mixture comprising titanium tetrachloride and acetonitrile.

39. A coated hard alloy cutting tool as claimed in claim 18, wherein said primary layer is deposited by reacting a mixture comprising titanium tetrachloride and acetonitrile.

40. A coated hard alloy cutting tool as claimed in claim 24, wherein said primary layer is deposited by reacting a mixture comprising titanium tetrachloride and acetonitrile.

* * * * *